United States Patent [19]

Kojima

[11] Patent Number: 5,406,229

[45] Date of Patent: Apr. 11, 1995

[54] PHASE LOCKED LOOP FREQUENCY SYNTHESIZER WITH FAST FREQUENCY SWITCHING

[75] Inventor: Tatsuru Kojima, Tokyo, Japan

[73] Assignee: NEC Corporation, Tokyo, Japan

[21] Appl. No.: 220,023

[22] Filed: Mar. 30, 1994

[30] Foreign Application Priority Data

Mar. 30, 1993 [JP] Japan .................................. 5-072197

[51] Int. Cl.⁶ ........................ H03L 7/085; H03L 7/18
[52] U.S. Cl. ...................................... 331/14; 331/16; 331/25
[58] Field of Search ............................. 331/14, 16, 25

[56] References Cited

U.S. PATENT DOCUMENTS

| | | | |
|---|---|---|---|
| 3,921,095 | 11/1975 | Chu | 331/1 A |
| 4,442,412 | 4/1984 | Smith et al. | 331/17 |
| 5,036,295 | 7/1991 | Kamitani | 331/16 X |
| 5,126,693 | 6/1992 | Gulliver et al. | 331/14 |
| 5,334,952 | 8/1994 | Maddy et al. | 331/14 X |

FOREIGN PATENT DOCUMENTS

| | | |
|---|---|---|
| 0481804 | 4/1992 | European Pat. Off. |
| 3635429 | 4/1988 | Germany |
| 1-151824 | 6/1989 | Japan |
| 3-054917 | 3/1991 | Japan |

*Primary Examiner*—Siegfried H. Grimm
*Attorney, Agent, or Firm*—Sughrue, Mion, Zinn, Macpeak & Seas

[57] ABSTRACT

A frequency synthesizer, which realizes speed-up of channel switching between channels having separated frequencies, has an EEPROM which stores the phase difference between a first frequency divider and a second frequency divider producing outputs corresponding to the frequencies of the channels to be switched. A delay circuit delays the output of the second frequency divider by an amount corresponding to an amount of the phase difference stored in the EEPROM. A controller supplies the outputs of the second frequency divider and the delay circuit to a phase detector. Further, the controller stops a PLL operation and restarts it in synchronism with a leading edge of, preferably, a second period of the output signal of the reference oscillator to which the preset phase difference is given.

10 Claims, 2 Drawing Sheets

FIG. 2(a) — OUTPUT OF THE SECOND FREQUENCY DIVIDER

FIG. 2(b) $f_r$ (102) / $f_v$ (101) — OUTPUT OF THE FIRST FREQUENCY DIVIDER

FIG. 2(c) V — RAMP VOLTAGE

CH ASSIGNMENT
FIG. 3(d) RAMP VOLTAGE 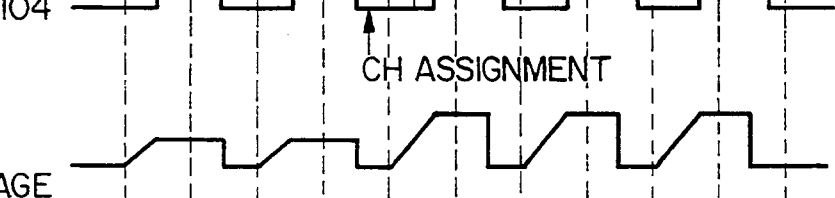
FIG. 3(e) SAMPLE CLOCK 
FIG. 3(f) CONTROL VOLTAGE 

PHASE LOCKED LOOP FREQUENCY SYNTHESIZER WITH FAST FREQUENCY SWITCHING

BACKGROUND OF THE INVENTION

1. Field of the Invention

The present invention relates to a frequency synthesizer and, more particularly, to a high speed switching technique for switching transmitting/receiving channels in a mobile radio communication system.

2. Description of the Related Art

It has been anticipated that current analog mobile telephone systems will reach capacity in the near future because the recent, substantial increase in the number of mobile telephone subscribers. Therefore, digital mobile telephone systems are being introduced. Such digital systems require terminals capable of switching channels at high speed.

To realize high speed switching, a phase locked loop (PLL) frequency synthesizer controlling one or both of input frequencies to a phase detector may be used. Such a PLL frequency synthesizer is described, for example, in Japanese Laid-Open Patent Publication No. 151824/1989 (JP-A-01-151824) or Japanese laid-Open Patent Publication No. 54917/1991 (JP-A-03-54917). In such PLL frequency synthesizers, the switching time from one channel to a channel adjacent thereto requires a time period of as short as 100 μs. However, when it is necessary to switch from a channel of one extreme frequency of a band to a channel of the other extreme frequency, it takes a time which is 10 to 20 times greater. This is caused by "take-in time", which is indispensable for PLL operation.

SUMMARY OF THE INVENTION

It is therefore an object of the present invention to provide a frequency synthesizer capable of switching the frequency of a channel to that of another channel remote therefrom at the high speed realized in channel switching between adjacent channels.

According to the present invention, an inventive frequency synthesizer includes a voltage-controlled oscillator, a first frequency divider for dividing the frequency of an output of the voltage-controlled oscillator, a reference oscillator, a second frequency divider for dividing the frequency of an output of the reference oscillator, a phase detector for outputting a voltage corresponding to a phase difference between the outputs of the first frequency divider and the second frequency divider, a loop filter constituting a control loop for providing an input of the voltage controlled oscillator by removing a high frequency component of the output of the phase comparator, memory for preliminarily storing the phase difference between the output frequencies of the first frequency divider and the second frequency divider, which frequency correspond to that of the channels to be switched, a delay circuit for delaying the output of the second frequency divider by an amount corresponding to an amount of the phase difference stored in the memory, a controller for stopping an operation of the control loop for a predetermined short time at the channel switching, and a switch circuit for supplying to the phase detector an output of the delay circuit as a substitute for the output of the first frequency divider and for supplying to the phase detector the output of the first frequency divider at an end of the predetermined short time.

The frequency synthesizer further updates the amount of the phase difference stored in the memory upon completion of each channel switching.

The frequency synthesizer gives the phase difference corresponding to an another channel to the output of the reference oscillator when a channel is switched to the another channel. The control voltage of the voltage-controlled oscillator is changed by this preliminarily given phase difference to realize a high speed switching. In this case, in order to remove the take-in time which is indispensable for the PLL operation, the PLL operation is stopped temporarily and restarted in synchronism with a leading edge of, preferably, a second period of the output signal of the reference oscillator to which the preset phase difference is given. Since, therefore, the PLL operation is restarted at a frequency at which the preset phase difference is given, it is possible to shorten the take-in time of the PLL operation.

Further, it is possible to deal with a variation of phase difference due to variation of characteristics of the voltage-controlled oscillator by updating the preset value upon detection of a phase difference at a time when the channel is locked.

BRIEF DESCRIPTION OF THE DRAWINGS

The above and other objects, features and advantages of this invention will become more apparent from the following detailed description taken with the accompanying drawings in which:

FIGS. 2(a)-2(c) are timing charts in the sample/hold type phase detector shown in FIG. 1; and FIGS. 3(a)-3(g) are timing charts for various parts of the circuit shown in FIG. 1.

In the drawings, the same reference numerals denote the same structural elements.

DESCRIPTION OF THE PREFERRED EMBODIMENT

A preferred embodiment of the present invention will now be described in detail with reference to accompanying drawings.

Figure 1:
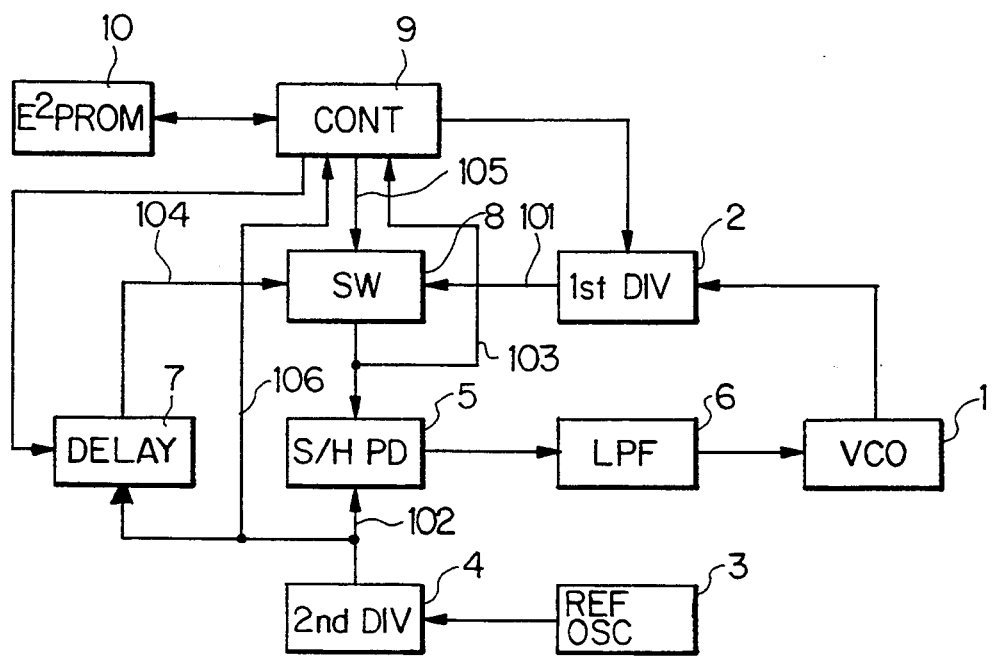
FIG. 1 is a block diagram of a preferred embodiment of the frequency synthesizer of the present invention.

In FIG. 1, a frequency synthesizer according to a preferred embodiment of the present invention consists of a voltage-controlled oscillator (VCO) 1, a first frequency divider (1st DIV) 2, a reference oscillator (REF OSC) 3, a second frequency divider (2nd DIV) 4, a sample/hold type phase detector (PD) 5, a loop filter or low pass filter (LPF) 6, a delay circuit 7, a switch circuit (SW) 8, a controller (CONT) 9, and a electrically erasable and programmable read only memory (EEPROM) 10.

The frequency synthesizer is basically a PLL synthesizer utilizing a sample/hold type phase detector. A voltage-controlled signal of the VCO 1 is frequency-divided by the 1st DIV 2 and supplied to one input terminal of the PD 5 through the SW 8. A frequency dividing ratio of the 1st DIV 2 is set by the controller 9. A reference signal of the REF OSC 3 is frequency-divided by the 2nd DIV 4 and supplied to the other input terminal of the PD 5.

As shown in FIG. 2(c) indicating a ramp voltage of the PD 5, the PD 5 generates the D.C. voltage proportional to a phase difference between two inputs by starting a charging of a ramp capacitor at a leading edge of a second divided signal 102 (fr) of the 2nd DIV 4 and completing the charging at a leading edge of a first divided signal 101 (fv) of the 1st DIV 2. The D.C. voltage is held in a hold capacitor in the PD 5, resulting in a control voltage for the VCO 1. That is, the oscillation frequency of the VCO can be made variable by controlling this phase difference.

The D.C. voltage, whose high frequency component, if there is any, is removed by the LPF 6, is applied to a control terminal of the VCO 1.

The EEPROM 10 preliminarily stores the phase difference between the first divided signal 101 of the 1st DIV 2 and the second divided signal 102 of the 2nd DIV 4 corresponding to the frequencies of the channels to be switched. The controller 9 supplies the phase difference information of the EEPROM 10 to the delay circuit 7 at a time of channel switching. The delay circuit 7 delays the second divided signal 102 of the 2nd DIV 4 by an amount corresponding to an amount of the phase difference stored in the EEPROM 10.

At the time of channel switching, the controller 9 supplies a delayed signal 104 of the delay circuit 7 as a substitution for the first divided signal of the 1st DIV 2 at the same time it stops an operation of the 1st DIV 2. After channel switching, the controller 9 restarts the operation of the 1st DIV 2 in synchronism with a second leading edge of the delayed signal 104 (an output 103 of the SW 8) and switches the SW 8 to supply the first divided signal 101 to the SW 8 after the restarting.

Moreover, the controller 9 updates the amount of the phase difference stored in the EEPROM 10 based on the difference between the second divided signal 102 and the first divided signal 101 (the output 103 of the SW 8).

Next, an operation of the preferred embodiment of the present invention will be described with reference to FIGS. 3(a)-3(g).

Figure 3A:
Figure 3B:
Figure 3C:
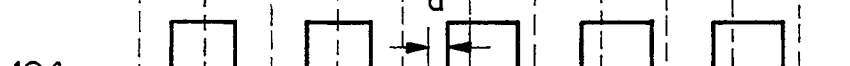
Figure 3G:

When a certain channel which is locked is changed to another channel, the controller 9 reads, from the EEPROM 10, a phase difference d (FIG. 3(b)) corresponding to the another channel and sets the value d in the delay circuit 7. The delay circuit 7 delays the leading edge of the second divided signal 102 of the 2nd DIV 4 by the phase difference d and supplies the delayed signal 104 (FIG. 3(c)) to the SW 8.

The controller 9 further switches the output 103 of the SW 8 from the first divided signal 101 of the 1st DIV 2 to the delayed signal 104 of the delay circuit 7 in synchronism with a first leading edge of the second divided signal 102 of the 2nd DIV 4 after the channel switching operation. In this switching timing of the SW 8, the reason for using the leading edge of the second divided signal is that the leading edge of the second divided signal is a timing at which the PD 5 starts the charging of the ramp capacitor. If the SW 8 is switched after the leading edges of the second divided signal 102 and the delayed signal 104 is passed, the ramp voltage becomes high because the ramp capacitor continues charging. Therefore, an oscillation frequency of the VCO 1 is, different from the required frequency and it takes a long time to switch channels. The leading edge of the second divided signal, preferably, the first leading edge is used as the switching timing because it shorten the time for the channel switching. After the SW 8 is switched, the delayed signal 104 and the second divided signal 102 are supplied to the PD 5. The phase difference between the two inputs of the PD 5 is d.

Simultaneously with the switching of the SW 8, the controller 9 temporarily stops the operation of the 1st DIV 2 in order to stop the PLL operation performed by the 1st DIV 2, the PD 5, the LPF 6, and the VCO 1 and to re-start the PLL operation in synchronism with the delayed signal 104 of the delay circuit 7 which is delayed by the phase difference d. With this scheme, it is possible to shorten the take-in time of the PLL operation.

After the operation of the 1st DIV 2 is restarted in synchronism with a second leading edge of the output 103 of the SW 8 after its switching, the output of the SW 8 is switched to the first divided signal 101 of the 1st DIV 2 again. The reason for this synchronization with the second leading edge of the output 103 is to make the switching operation reliable even if the phase difference between the output 101 of the 1st DIV 2 and the output 102 of the 2nd DIV 4 is very small.

Further, the controller 9 performs control procedures of detecting the phase difference d' when the channel is actually locked from the output 103 of the SW 8 and the second divided signal 102 of the 2nd DIV 4, correcting the preliminarily written value d to the new value d' and storing the new value d' in the EEPROM 10. With this operation, it is possible to deal with variations of the preset value of the phase difference d due to variations of the operational characteristics of such as the VCO 1.

As hitherto described, the present invention makes it possible to switch the frequency of one channel to that of another channel remote from the one channel at as high speed as that in switching between adjacent channels.

What is claimed is:

1. A frequency synthesizer comprising:
voltage-controlled oscillator means for supplying a voltage-controlled signal;
first frequency dividing means for dividing a frequency of the voltage-controlled signal and for supplying a first divided signal;
reference oscillator means for supplying a reference signal;
second frequency dividing means for dividing a frequency of the reference signal and for supplying a second divided signal;
phase detecting means for outputting a voltage signal corresponding to a phase difference between the first divided signal and the second divided signal;
loop filter means, constituting a control loop, for providing a control signal to said voltage controlled oscillator means corresponding to said voltage signal;
memory means for preliminarily storing the phase difference between the first divided signal and the second divided signal corresponding to channels having frequencies to be switched;
delay means for delaying the second divided signal by an amount corresponding to an amount of the phase difference stored in said memory means and for supplying a delayed signal;
control means for stopping an operation of said first dividing means for a short time at the channel switching; and
switching means for supplying the delayed signal as a substitution for the first divided signal.

2. The synthesizer as claimed in claim 1, wherein said control means switches said switching means in synchronism with a first leading edge of the second divided signal after the channel switching operation.

3. The synthesizer as claimed in claim 2, wherein said control means starts the operation of said first dividing means in synchronism with a second leading edge of the output of said switching means after the channel switching operation.

4. The synthesizer as claimed in claim 3, wherein said control means switches said switching means to supply the first divided signal to said phase detecting means after the restarting operation of said first dividing means.

5. The synthesizer as claimed in claim 1, said synthesizer further comprising means for updating the amount of the phase difference stored in said memory means.

6. The synthesizer as claimed in claim 1, wherein said phase comparing means is a sample hold type phase comparator.

7. The synthesizer as claimed in claim 1, wherein said short time corresponds to substantially one period of said second frequency dividing means.

8. A frequency synthesizer comprising:
   voltage-controlled oscillating means for supplying a voltage-controlled signal;
   first frequency dividing means for dividing frequency of the voltage-controlled signal;
   reference oscillating means for supplying a reference signal;
   second frequency dividing means for dividing frequency of the reference signal;
   phase detecting means for outputting a voltage signal corresponding to a phase difference between the first divided signal and the second divided signal;
   filter, constituting a control loop, for providing a control voltage to said voltage controlled oscillating means by removing a high frequency component of the voltage signal;
   memory means for preliminarily storing the phase difference between the outputs frequencies of said first frequency dividing means and said second frequency dividing means correspondingly to the frequencies of the channels to be switched;
   means for supplying the phase difference stored in said memory means to said phase detecting means so as to make the control voltage change; and
   controlling means for stopping an operation of the control loop for a short time at the channel switching.

9. The synthesizer as claimed in claim 8, wherein said supplying means comprising:
   delay means for delaying the second divided signal by an amount corresponding to an amount of the phase difference stored in said memory means; and
   switching means for supplying a delayed signal as a substitution for the first divided signal.

10. A method for controlling a frequency synthesizer, the method comprising the steps of:
   (a) supplying a voltage-controlled signal;
   (b) dividing a frequency of the voltage-controlled signal and supplying a first divided signal;
   (c) supplying a reference signal;
   (d) dividing frequency of the reference signal and supplying a second divided signal;
   (e) outputting a voltage signal corresponding to a phase difference between the first divided signal and the second divided signal;
   (f) providing a control signal by removing a high frequency component of the voltage signal so as to supply the voltage-controlled signal;
   (g) storing the phase difference between the first divided signal and the second divided signal corresponding to channels having frequencies to be switched;
   (h) supplying the stored phase difference so as to make the control voltage change; and
   (i) stopping an operation of said dividing step (b) for a predetermined short time at the channel switching.

* * * * *